United States Patent
Appel

(10) Patent No.: US 6,223,056 B1
(45) Date of Patent: Apr. 24, 2001

(54) SYSTEMS AND METHODS FOR DYNAMICALLY CONTROLLING A VARIABLE POWER AMPLIFIER

(75) Inventor: Mark J. Appel, Richardson, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/001,760

(22) Filed: Dec. 31, 1997

(51) Int. Cl.[7] .............................. H04B 1/38; H04B 1/04; H04B 17/00
(52) U.S. Cl. .......................... 455/561; 455/67.1; 455/127
(58) Field of Search .................... 455/67.1, 574, 455/38.3, 522, 115, 127, 561, 126, 572; 330/127, 129, 278; 370/342

(56) References Cited

U.S. PATENT DOCUMENTS

| | | | |
|---|---|---|---|
| 4,727,337 | * | 2/1988 | Jason ..................................... 330/298 |
| 5,150,075 | * | 9/1992 | Hietala et al. ........................ 330/279 |
| 5,193,223 | * | 3/1993 | Walczak et al. ...................... 455/115 |
| 5,287,555 | * | 2/1994 | Wilson et al. ........................ 455/115 |
| 5,305,468 | * | 4/1994 | Bruckert et al. ........................ 455/69 |
| 5,383,223 | * | 1/1995 | Inokuchi ................................. 375/60 |
| 5,406,225 | * | 4/1995 | Iida et al. .............................. 330/279 |
| 5,455,967 | * | 10/1995 | Amezawa et al. ...................... 455/69 |
| 5,548,826 | * | 8/1996 | Sayers ................................... 455/126 |
| 5,812,941 | * | 9/1998 | Cho ....................................... 455/126 |
| 5,839,056 | * | 11/1998 | Hakkinen .............................. 455/69 |
| 5,880,633 | * | 3/1999 | Leizerovich et al. .................. 330/84 |
| 5,929,776 | * | 7/1999 | Warble ............................ 340/825.44 |
| 6,047,167 | * | 4/2000 | Yamashita ............................ 455/126 |
| 6,091,934 | * | 7/2000 | Berman et al. ...................... 455/13.4 |
| 6,118,983 | * | 9/2000 | Egusa et al. ........................... 455/69 |
| 6,122,491 | * | 9/2000 | Francisco ............................. 455/127 |

\* cited by examiner

Primary Examiner—William G. Trost
Assistant Examiner—Joy K. Contee
(74) Attorney, Agent, or Firm—John C. Han

(57) ABSTRACT

There is disclosed, for use in a wireless communication system comprising at least one base station operable to communicate with a plurality of mobile units, a power controller for controlling a power consumption of a linear power amplifier in the base station. The power controller comprises: 1) a first power monitor for determining an RF output power level of the linear power amplifier; 2) a second power monitor for determining a primary power level consumed by the linear power amplifier; and 3) a processing circuit operable to determine an actual power ratio of the primary power level and the RF output power level and to adjust the primary power level to maintain the actual power ratio at approximately a selected target power ratio.

24 Claims, 4 Drawing Sheets

SYSTEMS AND METHODS FOR DYNAMICALLY CONTROLLING A VARIABLE POWER AMPLIFIER

TECHNICAL FIELD OF THE INVENTION

The present invention is directed, in general, to communication networks and, more specifically, to a wireless telephone network employing variable power transmitters.

BACKGROUND OF THE INVENTION

In 1996, more than 75 million people worldwide used cellular telephones. Reliable predictions indicate that there will be over 300 million cellular telephone customers by the year 2000. Within the United States, cellular service is offered not only by dedicated cellular service providers, but also by the regional Bell companies, such as U.S. West, Bell Atlantic and Southwestern Bell, and the national long distance companies, such as AT&T and Sprint. The enhanced competition has driven the price of cellular service down to the point where it is affordable to a large segment of the population.

This competition has also led to a rapid and sweeping innovation in cellular telephone technology. Analog cellular systems are now competing with digital cellular systems. Older frequency division multiple access (FDMA) and time division multiple access (TDMA) systems are now competing with code division multiple access (CDMA) systems. In order to maximize the number of subscribers that can be serviced in a single cellular system, frequency reuse is maximized by making individual cell sites smaller and using a greater number of cell sites to cover the same geographical area. Accordingly, the increased number of cellular base stations has resulted in increased infrastructure costs. To offset this increased cost, cellular service providers are eager to implement any innovations that may reduce equipment costs, maintenance/repair costs, and operating costs, or that may increase service quality/reliability, and the number of subscribers that the cellular system can service.

Much of this innovation has focused on service quality improvements, such as expanded digital PCS services or smaller and lighter cellular phone handsets having a longer battery life, or equipment cost reduction, such as smaller, cheaper, more reliable transceivers for the cellular base stations. However, there has been only limited innovation related to the reducing the operating costs of a cellular system. Electrical power is one of the more significant operating costs of a cellular system. Every cellular base station has a transmitter for sending voice and data signals to mobile units (i.e., cell phones, portable computer equipped with cellular modems, and the like) and a receiver for receiving voice and data signals from the mobile units. The transmitter and receiver both use power amplifiers to increase the strengths of received signals and transmitted signals.

In the prior art CDMA cellular systems, power control has been implemented to control the power transmitted by a nearby mobile unit and the power transmitted by a distant mobile unit. This is done to overcome the near-far effect, whereby the stronger signal from a nearby mobile unit overwhelms the weaker signal of a distant mobile unit. The power output level of the mobile units is adjusted according to a combination of the received signal strength in the mobile unit and fine adjustment messages received from the base transceiver station.

CDMA systems use some coded channels as control channels. The control channels include a pilot channel, a synchronization channel, a paging channel and an access channel. After a mobile unit is powered up, the mobile unit sends out a registration message and then monitors the pilot, paging, and synchronization channels in order to establish a communication link with a base transceiver station.

The pilot signal is transmitted at constant power by the base transceiver station. A newly activated mobile unit sees a stronger or weaker pilot signal, depending on where the mobile unit is located with respect to the base transceiver station. The mobile unit tries to access the base transceiver station at a first selected transmitted signal power level. If the access fails, the mobile unit tries again at a higher transmitted signal power level. This process continues until the mobile unit either times out or accesses the base transceiver station.

Once the mobile unit accesses the base transceiver station, the mobile unit begins transmitting voice and/or data signals at a nominal transmitted signal power level established by the base transceiver station. Thereafter, the base transceiver station sends signals containing an UP/DOWN bit to the mobile units that cause the mobile units to increase power (i.e., UP) by small amount if the UP/DOWN bit is set, or reduce power (i.e., DOWN) by a small amount if the UP/DOWN bit is not set. The power of a nearby mobile unit is reduced, and the power of a distant mobile unit is increased, by the separate UP/DOWN control signals repetitively sent to each by the base transceiver station. The process is repeated in multiple message frames until the two signals are received at the base transceiver station at roughly equal power levels.

CDMA systems also implement power control over the RF signal transmitted by the base transceiver station. This type of power control is implemented to minimize interference with transmissions in adjacent cells. In some CDMA systems, the base transceiver station automatically steps down the RF output power level in the traffic channels by a specified decrement, $\Delta 1$. The value of $\Delta 1$ is sufficiently small so that the output power level of the RF signal transmitted by the base transceiver station gradually reduces over a number of message frames. However, once a mobile unit determines that the signal from the base transceiver station is unacceptably weak, for example, by detecting five bad frames in a row, the mobile unit transmits a power control signal to the base transceiver station that causes the base transceiver station to begin to step up the power level by a specified increment, $\Delta 2$.

However, the prior art CDMA cellular systems do not exercise power control within the base station itself. CDMA systems cannot tolerate large amounts of signal distortion, and therefore require the use of RF amplifiers having good linearity characteristics across a wide range of operating conditions in order not to violate the IS 95 bandwidth requirements due to spectral spreading effects. Unfortunately, the DC-to-RF conversion efficiency for linear RF amplifiers is very low. CDMA amplifiers generally require about 8–10 dB of overhead input power ratio in order to maintain linearity in the RF waveforms.

The transmitter power amplifier consumes a constant and comparatively large amount of power, regardless of the relative strength of the output signal transmitted by the base transceiver station. For example, if the normal traffic load during the daytime requires the RF output power level to be approximately 10 watts, the DC prime power consumed by the transmitter power amplifier is approximately 80–100 watts (i.e., 8–10 dB higher). However, in the middle of the night, when the traffic load is very light, the RF output power level of the transmitter may be reduced in decrements down to, for example, about 1 watt, as power control is exercised over the RF output signal as described above. However, the DC prime power consumed by the transmitter power amplifier will still be approximately 80–100 watts, since the operating bias points of the power amplifiers are fixed. In the prior art systems, no consideration is given to whether the DC power consumption of the transmitter amplifier can be reduced and still maintain the existing output RF power level.

There is therefore a need in the art for improved cellular systems that are less expensive to operate. In particular, there is a need in the art for improved CDMA cellular systems that implement power control in the power amplifiers of the base station transmitters. Improved systems are needed that monitor and maintain an RF output signal level of an amplifier, while simultaneously reducing the DC power level required to produce the RF output signal.

SUMMARY OF THE INVENTION

To address the above-discussed deficiencies of the prior art, it is a primary object of the present invention to provide, for use in a wireless communication system comprising at least one base station operable to communicate with a plurality of mobile units, a power controller that uses a reduced amount of power compared to the prior art systems.

Accordingly, in one embodiment of the present invention, there is provided a power controller for controlling the power consumption of a linear power amplifier in the base station. The power controller comprises: 1) a first power monitor for determining an RF output power level of the linear power amplifier; 2) a second power monitor for determining a primary power level consumed by the linear power amplifier; and 3) a processing circuit operable to determine an actual power ratio of the primary power level and the RF output power level and to adjust the primary power level to maintain the actual power ratio at approximately a selected target power ratio.

In one embodiment of the present invention, the processing circuit adjusts the bias current of the linear power amplifier.

In some embodiments of the present invention, the selected target power ratio is selected to ensure a linear operation of the linear power amplifier.

In alternate embodiments of the present invention, the selected target power ratio is a minimum threshold value.

In other embodiments of the present invention, the selected target power ratio is a range having a maximum value and a minimum value.

In still other embodiments of the present invention, the selected target power ratio is a variable value determined by a traffic load condition in the wireless communication system.

In other embodiments of the present invention, the processor circuit adjusts the primary power level no lower than a minimum primary power level threshold.

In other embodiments of the present invention, the processor circuit adjusts the primary power level in anticipation of a future change in the RF output power level.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged process facility.

Additionally, the descriptions that follow of exemplary embodiments of the present invention may sometimes use specific values for certain circuit parameters, such as resistance values, current levels, voltage levels, logic levels, and the like. It should be clearly understood that these specific values have been selected only for the purposes of simplicity and clarity in explaining the operation of the present invention. These specific values should not be construed in any way to limit the scope of the claimed invention. It will be understood by those skilled in the art that alternate embodiments of the present invention may readily be implemented that use different values for these and other circuit parameters.

Figure 1:
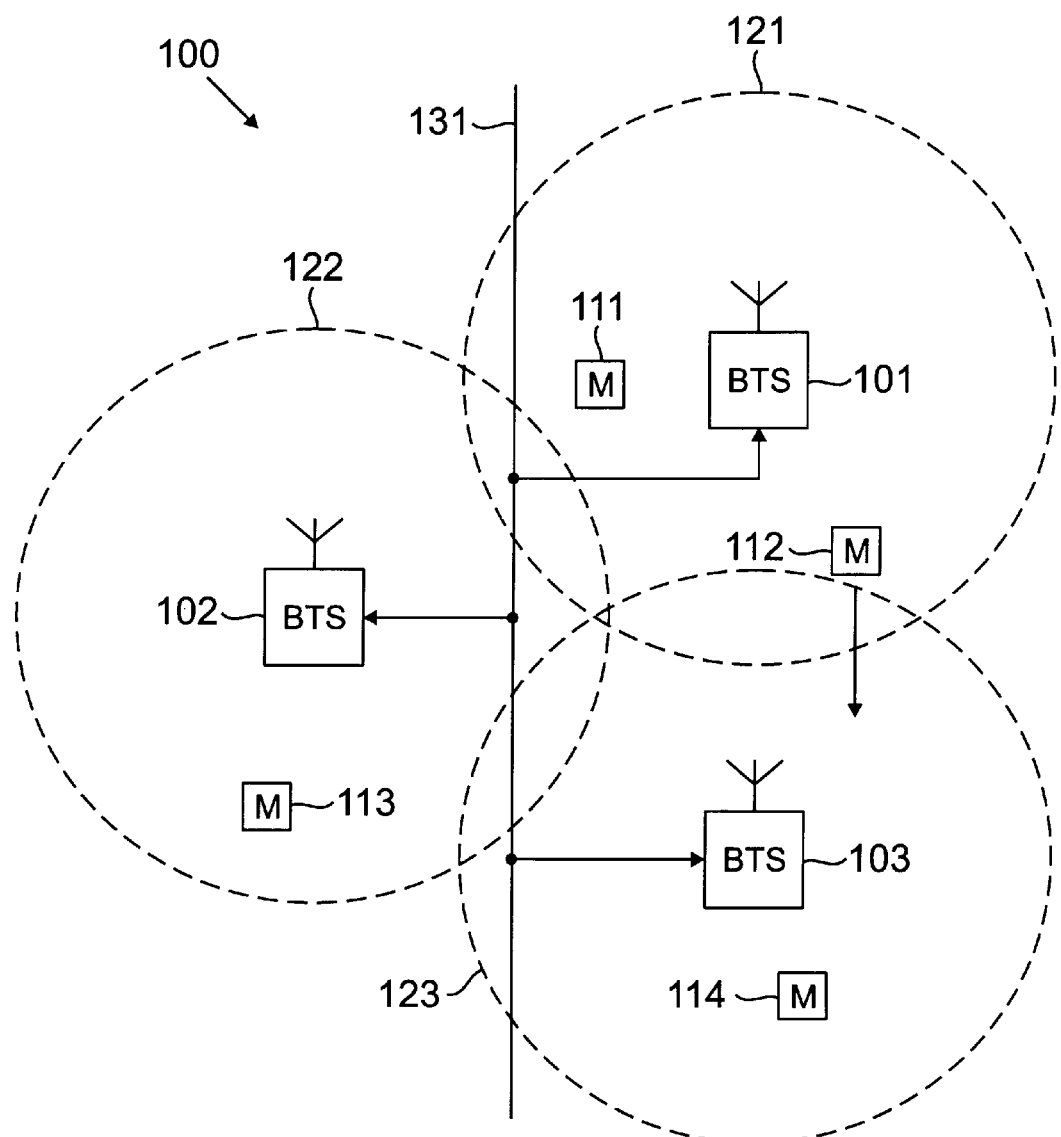
FIG. 1 illustrates an exemplary wireless telephone network according to one embodiment of the present invention.

FIG. 1 illustrates an exemplary wireless telephone network 100 according to one embodiment of the present invention. The wireless telephone network 100 comprises a plurality of cell sites 121–123, each containing one of the base transceiver stations, BTS 101, BTS 102, or BTS 103. In a preferred embodiment of the present invention, the wireless telephone network 100 is a CDMA-based network. Base transceiver stations 101–103 are operable to communicate with a plurality of mobile units (M) 111–114. Mobile units 111–114 may be any suitable cellular devices, including conventional cellular telephones, PCS handset devices, portable computers, metering devices, and the like.

Dotted lines show the approximate boundaries of the cells sites 121–123 in which base transceiver stations 101–103 are located. The cell sites are shown approximately circular for the purposes of illustration and explanation only. It should be clearly understood that the cell sites may have other shapes, such as hexagonal, depending on the cell configuration selected and natural and man-made obstructions.

BTS 101, BTS 102 and BTS 103 transfer voice and data signals between each other and the public telephone system (not shown) via communications line 131. Communications line 131 may be any suitable connection means, including a T1 line, a T3 line, a fiber optic link, a network backbone connection, and the like. In some embodiments, BTS 101, BTS 102 and BTS 103 may be wirelessly linked to one another and/or the public telephone network by a satellite link.

In the exemplary wireless network 100, mobile unit 111 is located in cell site 121 and is in communication with BTS 101, mobile unit 113 is located in cell site 122 and is in communication with BTS 102, and mobile unit 114 is located in cell site 123 and is in communication with BTS 103. The mobile unit 112 is located in cell site 121, close to the edge of cell site 123. The direction arrow proximate mobile unit 112 indicates the movement of mobile unit 112 towards cell site 123. At some point as mobile unit 112 moves into cell site 123 and out of cell site 121, a "handoff" will occur.

A "handoff" is a well-known process for transferring control of a call from a first cell to a second cell. For example, if mobile unit 112 is in communication with BTS 101 and senses that the signal from BTS 101 is becoming unacceptably weak, mobile 112 may then switch to a BTS that has a stronger signal, such as the signal transmitted by BTS 103. Mobile unit 112 and BTS 103 establish a new communication link and a signal is sent to BTS 101 and the public telephone network to transfer the on-going voice and/or data signals through the BTS 103. The call is thereby seamlessly transferred from BTS 101 to BTS 103.

In a conventional wireless telephone system, the transmitters in BTS 101, BTS 102 and BTS 103 transmit outbound signals at a selected RF output power level according to the size (and perhaps the shape) of the coverage area of the cell site. The RF output power level is set to a minimum level that ensures that a mobile unit located near the boundary of each cell site receives a sufficiently strong signal to form a reliable communication link. Each mobile unit transmits control signal(s) to a base transceiver station to increase the RF output power level of the base transceiver station if the signal quality falls below a minimum acceptable threshold. Additionally, the base transceiver stations transmit power control signal(s) to the mobile units to increase or decrease the RF output power levels of the mobile units in order to ensure that the RF signals received from the mobile units are received at approximately equal power.

In a preferred embodiment of the present invention, the transmitters in the wireless telephone system 100 include variable power transmitter amplifiers that may reduce the DC prime power consumed by one or more of the base transceiver stations 101–103 whenever a base transceiver station determines that the power level of its RF output signal may be maintained at a lower DC prime power level in the power amplifier.

For the purpose of simplicity in further explaining the operation of the present invention, voice, data and/or control signals that are transmitted from a base station transceiver to a mobile unit shall hereinafter be referred to collectively as "forward channel signals." Additionally, voice, data and/or control signals that are transmitted from a mobile unit to a base station transceiver shall hereinafter be referred to collectively as "reverse channel signals."

Figure 2:
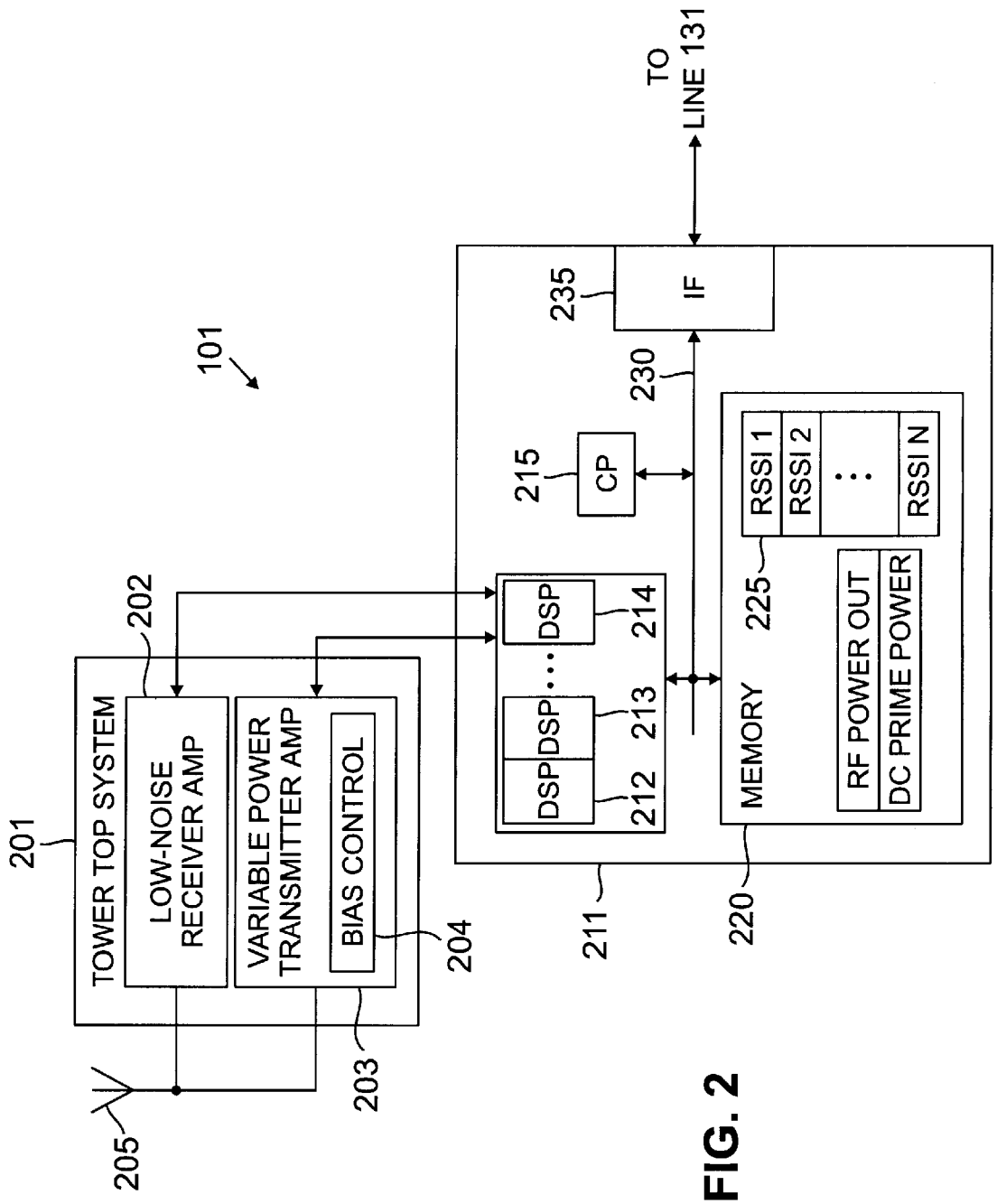
FIG. 2 illustrates an exemplary base transceiver station employing a variable power transmitter amplifier according to one embodiment of the present invention.

FIG. 2 illustrates an exemplary base transceiver station 101 employing a variable power transmitter amplifier 203 according to one embodiment of the present invention. BTS 101 comprises a tower top system 201 and a ground unit 211. The ground unit 211 is coupled to the communication line 131 via interface (IF) 235.

The tower top system 201 comprises a low-noise receiver amplifier 202, a variable power transmitter amplifier 203, and a bias control circuit 204. The low-noise receiver amplifier 202 receives the reverse channel signals transmitted by a mobile unit on antenna 205 and amplifies the received signals before relaying them to the ground unit 211, thereby minimizing line losses incurred in the link between the tower top system 201 and the ground unit 211. The variable power transmitter amplifier 203 transmits the forward channel signals to mobile unit(s) via antenna 205. The bias control circuit 204 adjusts the DC prime power used by the variable power transmitter amplifier 203. In other embodiments, separate antennas may be used to transmit and receive signals.

The ground unit 211 comprises a control processor (CP) 215, a memory 220 containing a data table 225, and plurality of digital signal processors (DSPs) 212–214. Under the control of the control processor 215, the DSPs receive voice, data and/or control signals from the low-noise receiver amplifier 202 and send voice, data, and/or control signals to the variable power transmitter amplifier 203. Data bus 230 provides communication between the components of ground unit 211.

The control processor 215 controls the operation of the digital signal processors 212, 213 and 214. Digital signal processors 212, 213 and 214 are capable of measuring the power level of the received reverse channel signals transmitted by the mobile units. The digital signal processors 212–214 can also detect and extract from the reverse channel signals one or more power control signals sent back from the mobile units to the base transceiver station 101 in order to control the RF output power level of the variable power transmitter amplifier 203.

The RF power control signals received from the mobile units and/or the RF power levels measured by the digital signal processors 212–214 may be stored in table 225 in memory 220 as received signal strength indicator (RSSI) data, RSSI 1 through RSSI N. Each of RSSI 1 through RSSI N is associated with one of the N reverse channel signals handled by the base transceiver station. The RF output power level of the variable power transmitter amplifier 203 is stored in memory 220 as the datum RF POWER OUT. Additionally, the operating power (or the DC prime power) used by the variable power transmitter amplifier 203 is in memory 220 as the datum DC PRIME POWER.

The control processor 215 continually monitors the values of RF POWER OUT and DC PRIME POWER to determine if the RF output power level has decreased to the point where the DC prime power in the variable power transmitter amplifier 203 may be reduced while still maintaining the current RF output power level. To reduce the DC prime power, the control processor 215 sends control signals to the bias control circuit 204 to adjust the DC bias current of the variable power transmitter amplifier 203.

It will be understood by those skilled in the art that the DC prime power (i.e., operating power) consumed by the variable power transmitter amplifier 203 is actually converted from AC power supplied by the local utility by an AC-DC converter located either in the variable power transmitter amplifier 203 or elsewhere in the base transceiver station 101. Reducing the amount of DC power consumed by the variable power transmitter amplifier 203 leads to a corresponding reduction in the amount of AC power used by the system, thereby lessening the utility costs of the base transceiver station 101.

Figure 3:
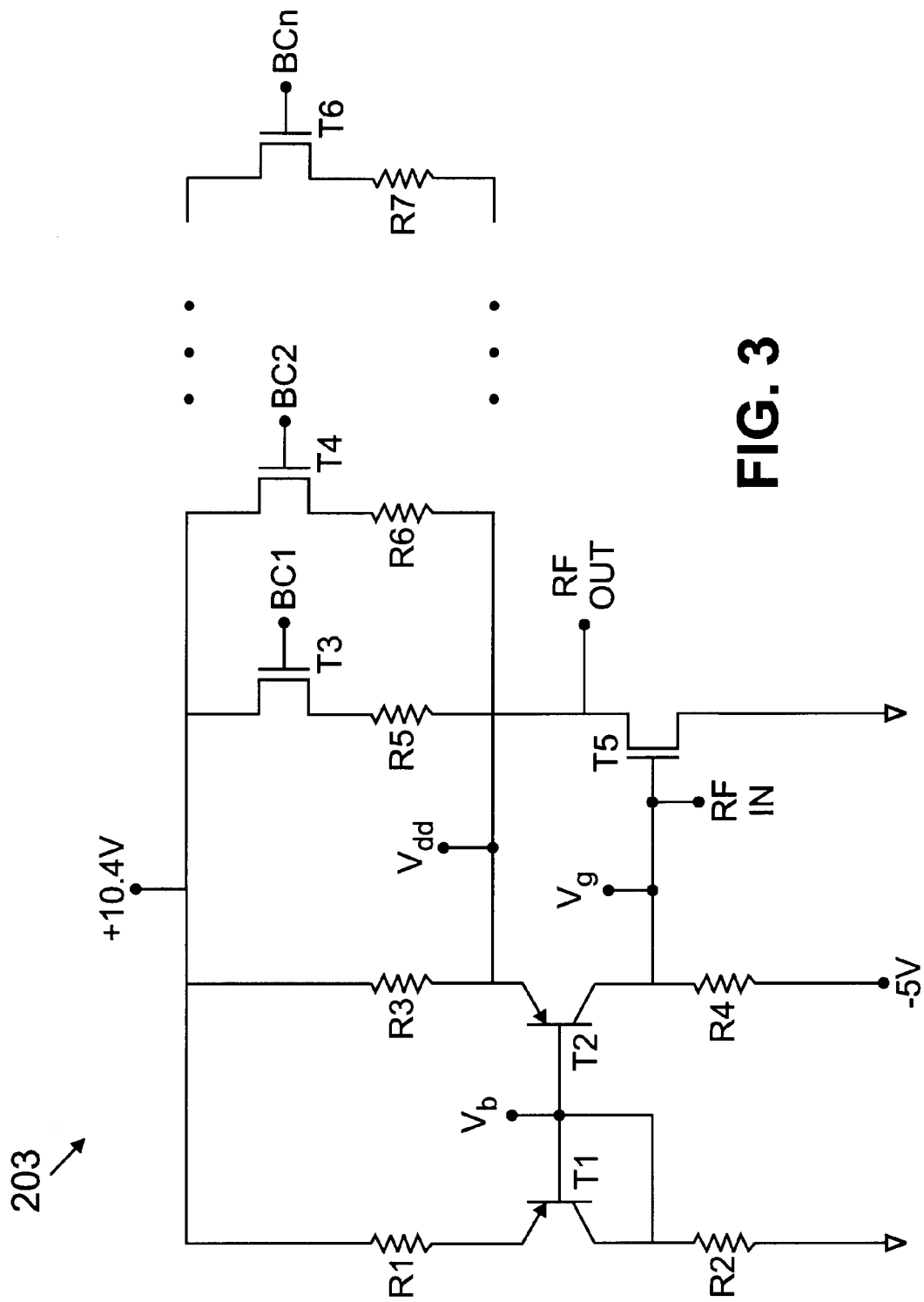
FIG. 3 illustrates an exemplary bias control circuit for a variable power transmitter amplifier according to one embodiment of the present invention.

FIG. 3 illustrates an exemplary bias control circuit 204 and an exemplary variable power transmitter amplifier 203 according to one embodiment of the present invention. The variable power transmitter amplifier 203 comprises a current mirror circuit formed by resistors R1, R2, R3 and R4, and PNP transistors T1 and T2, and a power amplifier formed by a high power FET transistor T5. In the exemplary embodiment shown, the variable power transmitter amplifier 203 operates from DC supply voltages of +10.4 volts and −5 volts. The DC supply voltages are derived from one or more AC-DC converters (not shown) located in the base transceiver station 101.

The bias control circuit 204 comprises MOSFET transistors T3 and T4 and resistors R5 and R6. Transistor T3 and resistor R5 form a first bias control stage that is selectable by the bias control signal BC1. Transistor T4 and resistor R6 form a second bias control stage that is selectable by the bias control signal BC2. Additional bias control stages may be added depending on the degree of DC prime power control desired. For example, MOSFET transistor T6 and resistor R7 represent the "nth" bias control stage that may be added to the bias control circuit 204 in order to increase the number of selectable DC prime power levels. The bias control signals, BC1, BC2, BC3, . . . , BCn, are used to select one of $2^n$ possible DC prime power levels.

Resistor R1, transistor T1 and resistor R2 form a reference arm of the current mirror, whereby a reference current, $I_R$, flows through resistor R1,transistor T1 and resistor R2. For example, if the reference current, $I_R$, in low power mode is selected as 1 mA and the RF amplifier DC supply voltage, $V_{dd}$, is +10 VDC, then the voltage, $V_b$, at the base of transistors T1 and T2 is +9.3 VDC, R1 is 400 ohms and R2 is 9.3 kilohms. Since transistors T1 and T2 are a matched pair of transistors having the same base current, $I_b$, the same 1 mA reference current, $I_R$, flows through the emitter and collector of transistor T2.

When the variable power transmitter amplifier 203 is operating in a low power mode, the signals BC1 and BC2 are set to Logic 0 such that MOSFET transistors T3 and T4 are turned "OFF". When transistors T3 and T4 are OFF, no current flows through resistors R5 and R6. Therefore, all current flowing into transistor T5, transistor T2, and resistor R4 is supplied through resistor R3. If $V_{dd}$=+10 volts and the DC bias current (i.e., the load on RF OUT) during low power mode is fixed at 1 A, then the sensing resistor R3 is 0.4 ohms. The value of resistor R4 is selected to provide an appropriate DC bias voltage, $V_g$, on the gate of transistor T5.

If too much current is drawn through sensing resistor R3, the DC power level, $V_{dd}$, at the emitter of transistor T2 begins to drop and transistor T2 begins to turn OFF. This causes a corresponding drop in the bias voltage, $V_g$, on the gate of FET transistor T5. Accordingly, the current flow through the drain of transistor T5 begins to drop, thereby reducing the DC bias current flow in resistor R3. Conversely, if the DC bias current drawn through sensing resistor R3 fall too low, the DC power level, $V_{dd}$, at the emitter of transistor T2 begins to rise and transistor T2 turns ON more strongly. This causes a corresponding rise in the bias voltage, $V_g$, on the gate of FET transistor T5. Accordingly, the current flow through the drain of transistor T5 begins to rise, thereby increasing the current flow in resistor R3. The net effect is that DC bias current drawn through R3 is maintained at 1 A and the voltage, $V_{dd}$, is held at +10 VDC.

When the variable power transmitter amplifier 203 operates in a high power mode, one or more of MOSFET transistors T3 and T4 may be turned on by setting the bias control signals BC1, BC2, etc., to Logic 1 (i.e., a "high" voltage). Transistors T3 and T4 are essentially switches that, when turned "ON", place resistors R5 and/or R6 in parallel with sensing resistor R3. For example, if BC1 is Logic 1, T3 is ON and R5 is placed in parallel with resistor R3, thereby lowering the effective resistance of the sensing resistor formed by R3∥R5. This increases the DC current supplied to transistor T5 and the output load. For example, if R3 is 0.4 ohms and R5 is 0.8 ohms, R3∥R5 is 0.2667 ohms and the DC current is (0.4 VDC/0.2667 ohms) =1.5 A.

In a still higher power mode, the DC current may be further increased by setting BC2 to Logic 1, thereby turning transistor T4 ON and placing resistor R6 in parallel with R3∥R5. Additional DC prime power levels may be selected across a range of $2^n$ power levels by varying the effective resistance of the sensing resistor(s) in order to control the DC bias current. The control processor 215 can therefore adjust the DC bias current in the variable power transmitter amplifier 203 by setting the values of the bias control signals, BC1, BC2, BC3, . . . , BCn, to Logic 1 or Logic 0.

The preceding description of an exemplary embodiment of the present invention specified specific logic level values to enable transistors T3, T4, T5, etc. These specific values were selected only for the purposes of simplicity and clarity in explaining the operation of the present invention. These specific values should not be construed in any way to limit the scope of the claimed invention. Those skilled in the art will appreciate that in alternate embodiments of the present invention, the logic levels (i.e., Logic 0 or Logic 1) used to enable transistors T3, T4, T5, T6, etc. will vary depending on whether the transistors selected are p-channel devices or n-channel devices.

Figure 4:
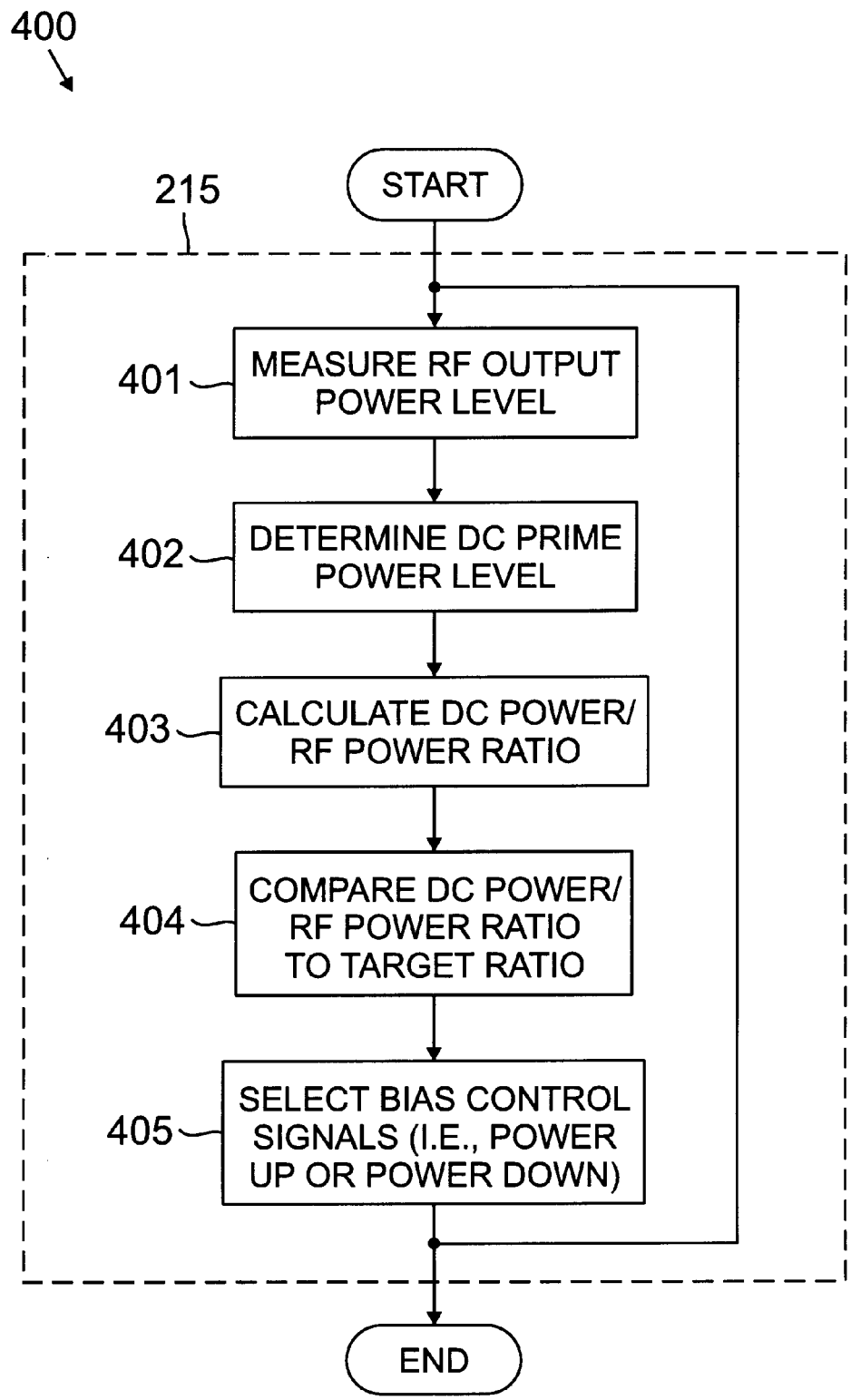
FIG. 4 is a flow diagram illustrating the operation of a variable power transmitter amplifier according to one embodiment of the present invention.

FIG. 4 is a flow diagram 400 illustrating the operation of a variable power transmitter amplifier 203 according to one embodiment of the present invention. The power control algorithm is implemented by the control processor 215. During routine operation, the control processor causes the RF output power level and the DC prime power level of the variable power transmitter amplifier 203 to be measured, either by the DSPs or some other suitably arranged power meter(s) (process steps 401 and 402). In an alternate embodiment of the present invention, the DC prime power level may be determined by examining the settings of the bias control signals, BC1, BC2, . . . , BCn, and the RF output power level may be determined by examining the gain control settings of the RF signal amplifier(s) in the base transceiver station 101. Advantageously, this further reduces the cost of the base transceiver station 101 by eliminating the need for separate power meter equipment for use by the present invention.

Next, the control processor 215 calculates the actual ratio (in dB) of the DC prime power level and the RF output power level (i.e., DC power÷RF power) (process step 403). This DC power/RF power ratio is then compared to a target power ratio established for the system in order to maintain linear performance in the RF power amplification (process step 404). For example, if the target ratio is 10 dB, then the DC prime power level must be maintained at least ten (10) times the level of the RF output power level. The control processor 215 can then adjust the DC prime power level using the bias control signals, BC1, BC2, BC3, . . . , BCn, according to whether the calculated DC power/RF power ratio is below or above the target power ratio.

The above-described power adjustment cycle is automatically repeated at a cyclic base rate established by the system operator, but is preferably repeated frequently enough to compensate for rapidly changing traffic load conditions. Thus, the DC prime power level will always be sufficiently greater than the RF output power level to ensure amplifier linearity.

The target power ratio may be a minimum threshold level, or a range having a maximum value and a minimum value, or a combination of both. Additionally, the target power ratio may be a constant value or may be adjusted according to various criteria, such as time of day, current traffic load, expected maximum traffic load, maximum rate of change of traffic load, and the like. In some embodiments of the present invention, a minimum DC prime power level threshold may be established for the variable power transmitter amplifier 203. The control processor 215 will not reduce the DC prime power below the minimum DC prime power level threshold, even if it is therefore unable to maintain the actual DC power/RF power ratio at the target power ratio.

For example, during high-traffic daytime hours, the target power ratio may be set to 10 dB. If the RF output power level during high-traffic conditions is 10 watts, the target power ratio causes the control processor 215 to adjust the DC prime power to about 100 watts. However, during low-traffic nighttime hours, the target power ratio may be set to, for example, 20 dB. If the RF output power level during low-traffic conditions drops down to 1 watt, the target power ratio causes the control processor 215 to adjust the DC prime power down to about 20 watts, thereby saving 80 watts of power. However, if the target power ratio is kept constant at 10 dB for both high-traffic conditions and low-traffic conditions, the target power ratio causes the control processor 215 to adjust the DC prime power down to about 10 watts, thereby saving 90 watts of power.

The use of different target power ratios during high-traffic conditions and low-traffic conditions reflects the fact that the rate at which the high-traffic condition changes is not likely to be as rapid or a great as the rate at which the low-traffic condition changes. If one or two distant mobile units are suddenly activated, or are suddenly obstructed, the change that is needed in the transmitter RF output level to compensate for the new conditions will be comparatively greater in a transmitter operating in low-traffic conditions than in a transmitter already operating in high-traffic conditions.

In a preferred embodiment of the present invention, the control processor 215 can adjust the DC prime power level in anticipation of a sudden change in the RF output power level transmitted by the base station transceiver. The control processor 215 can do this based on a priori knowledge that the control processor 215 has in certain circumstances.

For example, if the variable power transmitter amplifier 203 is operating in a relatively low power mode and the control processor 215 detects in the access channels that several newly-activated mobile units are trying to access the base transceiver station 101, the control processor 215 may increase the DC prime power level without waiting for the RF output power level to rise in the traffic channels. The control processor 215 can do this based on the assumption that it is very likely that at least one of the newly-activated mobile units will be sufficiently remote from the base transceiver station 101 to require an increase in the RF output power level of the transmitter.

In a preferred embodiment of the present invention, the control processor 215 may also reduce the DC prime power level in anticipation of a sudden drop in the RF output power level transmitted by the base station transceiver. For example, if the control processor 215 detects that one or more remote mobile units that required a strong RF output power level from the base transceiver station 101 have been turned off, the control processor 215 may decrease the DC prime power level without waiting for the RF output power level to drop. The control processor 215 can do this if the control processor 215 knows that the remaining active mobile units are sufficiently close to the base transceiver station 101 to allow the RF output power level of the transmitter to safely be reduced.

Although the present invention has been described in detail, those skilled in the art should understand that they can make various changes, substitutions and alterations herein without departing from the spirit and scope of the invention in its broadest form.

What is claimed is:

1. For use in a wireless communication system comprising at least one base station operable to communicate with a plurality of mobile units, a power controller for controlling a power consumption of a linear power amplifier in said base station comprising:

a first power monitor for determining an RF output power level of said linear power amplifier;

a second power monitor for determining a primary power level consumed by said linear power amplifier; and a processing circuit operable to determine an actual power ratio of said primary power level and said RF output power level and to adjust said primary power level to maintain said actual power ratio at approximately a selected target power ratio.

2. The power controller set forth in claim 1 wherein said processing circuit adjusts a bias current of said linear power amplifier.

3. The power controller set forth in claim 1 wherein said selected target power ratio is selected to ensure a linear operation of said linear power amplifier.

4. The power controller set forth in claim 3 wherein said selected target power ratio is a minimum threshold value.

5. The power controller set forth in claim 3 wherein said selected target power ratio is a range having a maximum value and a minimum value.

6. The power controller set forth in claim 3 wherein said selected target power ratio is a variable value determined by a traffic load condition in said wireless communication system.

7. The power controller set forth in claim 1 wherein said processor circuit adjusts said primary power level no lower than a minimum primary power level threshold.

8. The power controller set forth in claim 1 wherein said processing circuit adjusts said primary power level in anticipation of a future change in said RF output power level.

9. A wireless communication system comprising a plurality of base stations operable to communicate with a plurality of mobile units, wherein at least one of said plurality of base stations comprises:

a linear power amplifier having an RF output power level and a primary power level; and a power controller for controlling said primary power level of said linear power amplifier comprising:

a first power monitor for determining said RF output power level of said linear power amplifier;

a second power monitor for determining said primary power level of said linear power amplifier; and a processing circuit operable to determine an actual power ratio of said primary power level and said RF output power level and to adjust said primary power level to maintain said actual power ratio at approximately a selected target power ratio.

10. The wireless communication system set forth in claim 9 wherein said processing circuit adjusts a bias current of said linear power amplifier.

11. The wireless communication system set forth in claim 9 wherein said selected target power ratio is selected to ensure a linear operation of said linear power amplifier.

12. The wireless communication system set forth in claim 11 wherein said selected target power ratio is a minimum threshold value.

13. The wireless communication system set forth in claim 11 wherein said selected target power ratio is a range having a maximum value and a minimum value.

14. The wireless communication system set forth in claim 11 wherein said selected target power ratio is a variable value determined by a traffic load condition in said wireless communication system.

15. The wireless communication system set forth in claim 9 wherein said processor circuit adjusts said primary power level no lower than a minimum primary power level threshold.

16. The wireless communication system set forth in claim 9 wherein said processing circuit adjusts said primary power level in anticipation of a future change in said RF output power level.

17. For use in a wireless communication system comprising at least one base station operable to communicate with a plurality of mobile units, a method for controlling a power consumption of a linear power amplifier in the base station comprising the steps of:

determining an RF output power level of the linear power amplifier;

determining a primary power level consumed by the linear power amplifier;

determining an actual power ratio of the primary power level and the RF output power level; and adjusting the primary power level to maintain the actual power ratio at approximately a selected target power ratio.

18. The method set forth in claim 17 wherein the step of adjusting adjusts a bias current of the linear power amplifier.

19. The method set forth in claim 17 wherein the selected target power ratio is selected to ensure a linear operation of the linear power amplifier.

20. The method set forth in claim 19 wherein the selected target power ratio is a minimum threshold value.

21. The method set forth in claim 19 wherein the selected target power ratio is a range having a maximum value and a minimum value.

22. The method set forth in claim 19 wherein the selected target power ratio is a variable value determined by a traffic load condition in the wireless communication system.

23. The method set forth in claim 17 wherein the step of adjusting adjusts the primary power level no lower than a minimum primary power level threshold.

24. The method set forth in claim 17 wherein the step of adjusting adjusts the primary power level in anticipation of a future change in the RF output power level.

* * * * *